（12） United States Patent
Punzalan et al.

(10) Patent No.: US 7,413,933 B2
(45) Date of Patent: *Aug. 19, 2008

(54) INTEGRATED CIRCUIT PACKAGE WITH LEADFRAME LOCKED ENCAPSULATION AND METHOD OF MANUFACTURE THEREFOR

(75) Inventors: Jeffrey D. Punzalan, Singapore (SG); Jae Hun Ku, Singapore (SG); Byung Joon Han, Singapore (SG)

(73) Assignee: ST Assembly Test Services Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 11/697,779

(22) Filed: Apr. 9, 2007

(65) Prior Publication Data

US 2007/0190694 A1    Aug. 16, 2007

Related U.S. Application Data

(63) Continuation of application No. 10/850,220, filed on May 19, 2004, now Pat. No. 7,217,599.

(60) Provisional application No. 60/478,433, filed on Jun. 12, 2003.

(51) Int. Cl.
*H01L 21/44* (2006.01)
(52) U.S. Cl. ............. 438/123; 257/667; 257/E23.039
(58) Field of Classification Search ......... 438/108–126, 438/611; 257/666, 676, 690, 735, 784, 787, 257/E23.039, E23.052
See application file for complete search history.

(56) References Cited

U.S. PATENT DOCUMENTS

| 5,648,682 | A | 7/1997 | Nakazawa et al. |
| 6,551,859 | B1 | 4/2003 | Lee et al. |
| 6,661,083 | B2 | 12/2003 | Lee et al. |
| 7,217,599 | B2 * | 5/2007 | Punzalan et al. ............ 438/123 |

* cited by examiner

*Primary Examiner*—Quoc D Hoang
(74) *Attorney, Agent, or Firm*—Mikio Ishimaru

(57) ABSTRACT

A semiconductor including a leadframe having a die attach paddle and a number of leads is provided. The die attach paddle has a recess to provide a number of mold dams around the periphery of the die attach paddle. An integrated circuit is positioned in the recess. Electrical connections between the integrated circuit and the number of leads are made, and an encapsulant is formed over the integrated circuit and around the number of mold dams.

20 Claims, 4 Drawing Sheets

INTEGRATED CIRCUIT PACKAGE WITH LEADFRAME LOCKED ENCAPSULATION AND METHOD OF MANUFACTURE THEREFOR

CROSS-REFERENCE TO RELATED APPLICATION

This application claims the benefit of U.S. Provisional Patent Application Ser. No. 60/478,433 filed Jun. 12, 2003, and the subject matter thereof is hereby incorporated herein by reference thereto.

This application is a continuation of U.S. Non Provisional Patent Application Ser. No. 10/850,220 filed May 19, 2004.

TECHNICAL FIELD

The present invention relates generally to semiconductor technology, and more particularly to a method and apparatus for an integrated circuit leadframe package.

BACKGROUND ART

In the electronics industry, the continuing goal has been to reduce the size of electronic devices such as camcorders and portable telephones while increasing performance and speed. Integrated circuit packages for complex systems typically are comprised of a multiplicity of interconnected integrated circuit chips. The integrated circuit chips usually are made from a semiconductor material such as silicon or gallium arsenide. Semiconductor devices are formed in the various layers of the integrated circuit chips using photolithographic techniques. The integrated circuit chips may be mounted in packages that are then mounted on printed wiring boards.

Packages including integrated circuit chips typically have numerous external pins that are mechanically attached by solder or a variety of other known techniques to conductor patterns on the printed wiring board.

Typically, the packages on which these integrated semiconductor chips are mounted include a substrate or other chip mounting device. One example of such a substrate is a leadframe. High performance leadframes typically are multilayer structures including power, ground, and signal planes.

Leadframes also typically include at least an area on which an integrated circuit chip is mounted and a plurality of power, ground, and/or signal leads to which power, ground, and/or signal sites of the integrated semiconductor chip are electronically attached. Semiconductor integrated chips may be attached to the leadframe using adhesive or any other techniques for attaching such chips to a leadframe which are commonly known to those skilled in the art, such as soldering. The power, ground and signal sites on the chip may then be electrically connected to selected power, ground and signal plane or individual leads of the leadframe.

Leadframes have been used extensively in the integrated circuit (IC) packaging industry mainly because of their low manufacturing cost and high reliability. Leadframe packages remain a cost-effective solution for packaging integrated circuits despite the introduction of various leadless packages in recent years.

Typical leadframe packages include a die attach paddle, or pad, surrounded by a number of leads. An integrated circuit chip, is attached to the die attach paddle using a conductive adhesive such as silver epoxy. The conductive adhesive is cured after die attach. After the die is attached to the die paddle, a wire-bonding process is used to make electrical interconnections between the integrated circuit and the leads of the leadframe. After wire bonding, the leadframe with the integrated circuit attached is encapsulated using a molding compound.

Such enclosures may include encapsulation in a plastic or a multi-part housing made of plastic ceramic, or metal. The enclosure protects the leadframe and the attached chip from physical, electrical, and/or chemical damage.

Finally, post mold curing and singulation steps are conducted to complete the packaging process.

The leadframe and attached chip(s) may then be mounted on, for example, a circuit board, or card along with other leadframes or devices. The circuit board or card may then be incorporated into a wide variety of devices such as computers, automobiles, or appliances, among others.

One problem that persists with leadframes is that the integrated circuits mounted on these leadframes are subject to failure due to moisture penetration of the integrated circuit package. If the molding compound is not securely attached to the leadframe, moisture or other contaminants can contact the integrated circuit thereby causing failures.

Another problem is that the molding compound does not flow evenly over the entire leadframe resulting in areas where moisture or other contaminants may contact the integrated circuit thereby contributing to the failure of the integrated circuit.

Solutions to these problems have been long sought but prior developments have not taught or suggested any solutions and, thus, solutions to these problems have long eluded those skilled in the art.

DISCLOSURE OF THE INVENTION

The present invention provides a semiconductor including a leadframe having a die attach paddle and a number of leads. The die attach paddle has a recess to provide a number of mold dams around the periphery of the die attach paddle. An integrated circuit is positioned in the recess. Electrical connections between the integrated circuit and the number of leads are made, and an encapsulant is formed over the integrated circuit and around the number of mold dams.

The present invention reduces failure of semiconductors due to moisture penetration of the integrated circuit package. The molding compound is attached more securely to the leadframe so moisture or other contaminants cannot contact the integrated circuit thereby causing failures.

Also, the molding compound flows evenly reducing the areas where moisture or other contaminants may contact the integrated circuit thereby reducing the failure of the integrated circuit.

Certain embodiments of the invention have other advantages in addition to or in place of those mentioned above. The advantages will become apparent to those skilled in the art from a reading of the following detailed description when taken with reference to the accompanying drawings.

BEST MODE FOR CARRYING OUT THE INVENTION

In the following description, numerous specific details are given to provide a thorough understanding of the invention. However, it will be apparent that the invention may be practiced without these specific details. In order to avoid obscuring the present invention, some well-known system configurations, and process steps are not disclosed in detail.

Likewise, the drawings showing embodiments of the present invention are semi-diagrammatic and not to scale and, particularly, some of the dimensions are for the clarity of presentation and are shown exaggerated in the FIGs.

The term "horizontal" as used herein is defined as a plane parallel to the conventional plane or surface of the leadframe, regardless of its orientation. The term "vertical" refers to a direction perpendicular to the horizontal as just defined. Terms, such as "on", "above", "below", "bottom", "top", "side" (as in "sidewall"), "higher", "lower", "over", and "under", are defined with respect to the horizontal plane.

The term "processing" as used herein includes deposition of material or photoresist, patterning, exposure, development, etching, cleaning, and/or removal of the material or photoresist as required in forming a described structure.

Figure 1:
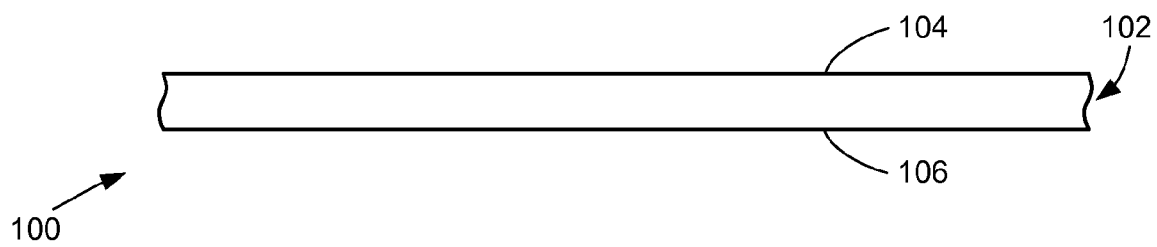
FIG. 1 is a partial cross-sectional view of a leadframe in an intermediate stage of manufacture in accordance with the present invention.

Referring now to FIG. 1, therein is shown a partial cross-sectional view of a semiconductor 100 in an intermediate stage of manufacture in accordance with the present invention. The semiconductor 100 includes a leadframe 102. The leadframe has an upper surface 104 and a lower surface 106.

Figure 2:
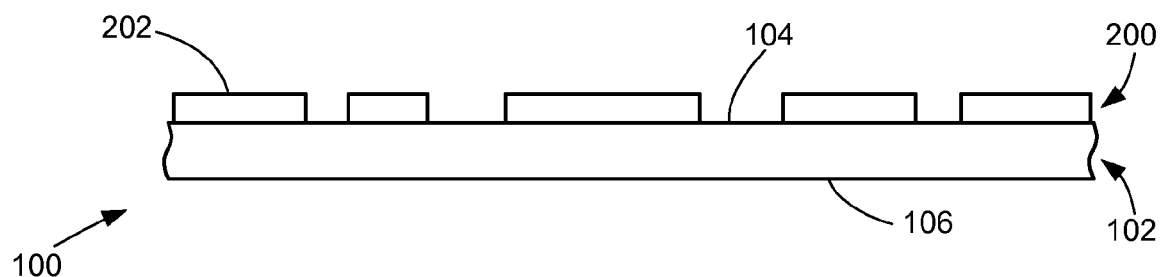
FIG. 2 is the structure of FIG. 1 after processing of a mask on the surface of the leadframe.

Referring now to FIG. 2, therein is shown the structure of FIG. 1 after processing to form a mask 200 on the upper surface 104 of the leadframe 102. The mask 200 is formed by depositing a layer of photoresist 202 on the upper surface 104 of the leadframe 102 and processing the layer of photoresist 202 to form the mask 200.

Figure 3:
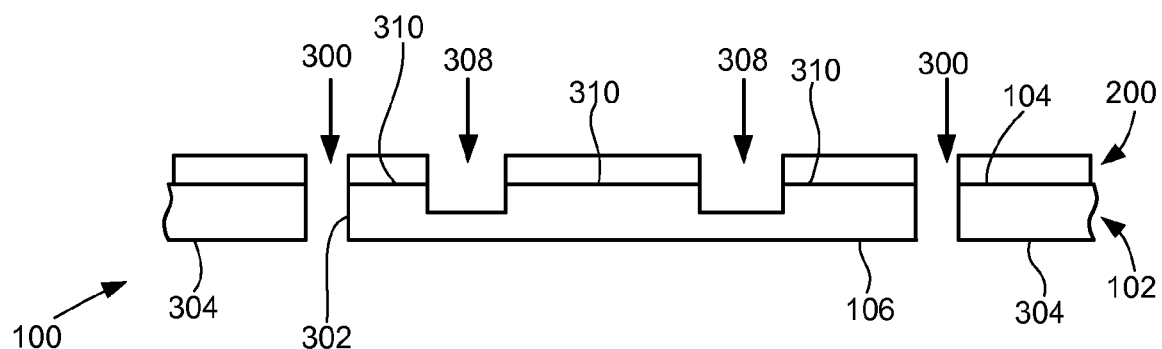
FIG. 3 is the structure of FIG. 2 after an etch process to form a die paddle.

Referring now to FIG. 3, therein is shown the structure of FIG. 2 after an etch process 300 has been performed on the upper surface 104 of the leadframe 102 using the mask 200. The leadframe 102 is etched using the mask 200 to form a die attach paddle 302 and a number of leads 304 surrounding the die attach paddle 302.

A recess 308 is formed in the leadframe 102 by etching only partially through the leadframe 102 to form a number of mold dams 310 in the die attach paddle 302. The recess 308 is formed interior to the peripheral areas of the die attach paddle 302. It has been discovered that etching the die paddle 302 of the leadframe 102 to about fifty-five percent (55%) of the thickness of the die paddle 302 to form the recess 308 results in providing suitable thickness for the number of mold dams 310 while maintaining the stiffness of the die paddle 302.

Figure 4:
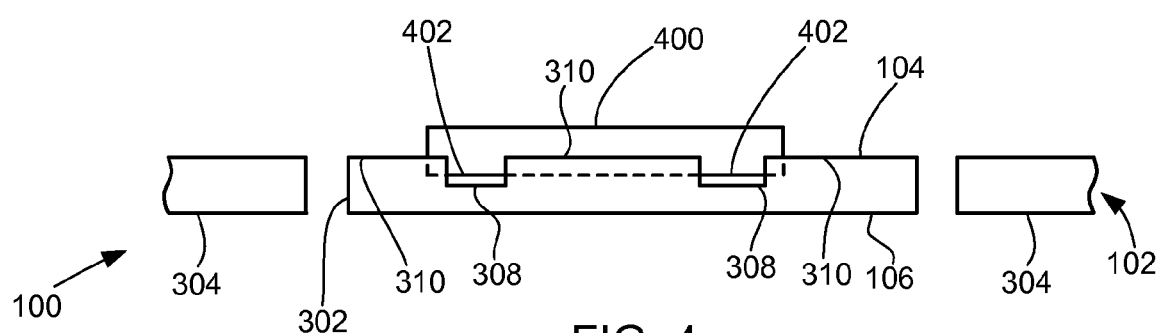
FIG. 4 is the structure of FIG. 3 after an integrated circuit is attached to the die paddle of the leadframe.

Referring now to FIG. 4, therein is shown the structure of FIG. 3 after an integrated circuit 400 is attached to the die paddle 302 of the leadframe 102. The mask 200 shown in FIG. 3 has been removed. A bonding compound 402, such as an epoxy, has been deposited in the recess 308 in the die attach paddle 302. The integrated circuit 400 is positioned on the die attach paddle 302 to be bonded by the bonding compound 402.

When the recess 308 is sufficiently deep, the integrated circuit 400 will be positioned partially below the upper surface 104 of the die attach paddle 302 and surrounded by the number of mold dams 310. The integrated circuit 400 is therefore locked in position by the number of mold dams 310 to provide additional stability for the integrated circuit 400.

Figure 5:
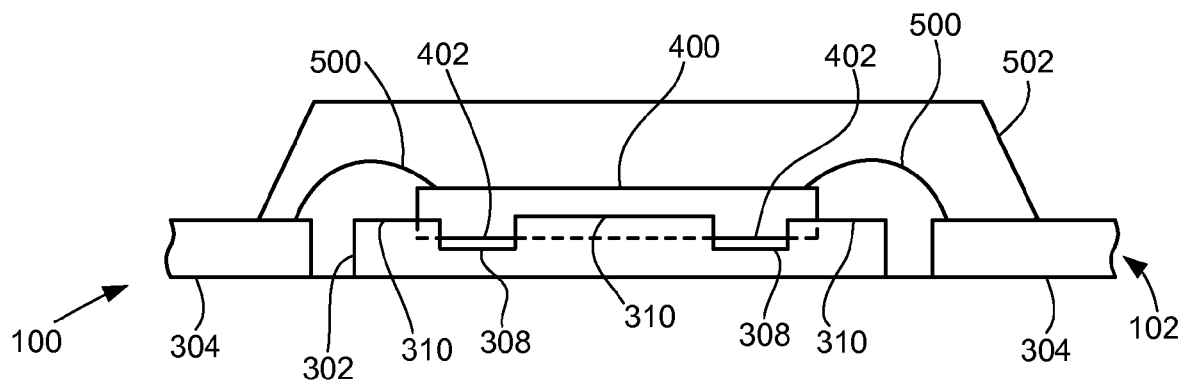
FIG. 5 is the structure of FIG. 4 after encapsulation of the integrated circuit.

Referring now to FIG. 5, therein is shown the structure of FIG. 4 after encapsulation of the integrated circuit 400. The integrated circuit 400 is electrically connected to the number of leads 304 using a number of bonding wires 500. An encapsulant 502, such as plastic, epoxy, ceramic, or other suitable material, is formed over the integrated circuit 400, the number of bonding wires 500, and a portion of the number of leads 304. The encapsulant 502 also fills the space between the number of leads 304 and the die attach paddle 302. During the encapsulation process, a mold (not shown) is used to direct the flow of the encapsulant 502 into any spaces between the mold dams 310 thereby providing a locking mechanism for the encapsulant 502.

It is therefore more difficult for the encapsulant 502 to pull away from the die attach paddle 302 or the integrated circuit 400 thereby enhancing the integrity and stability of the semiconductor 100. Moisture or other contaminants cannot as easily penetrate the semiconductor 100.

Figure 6:
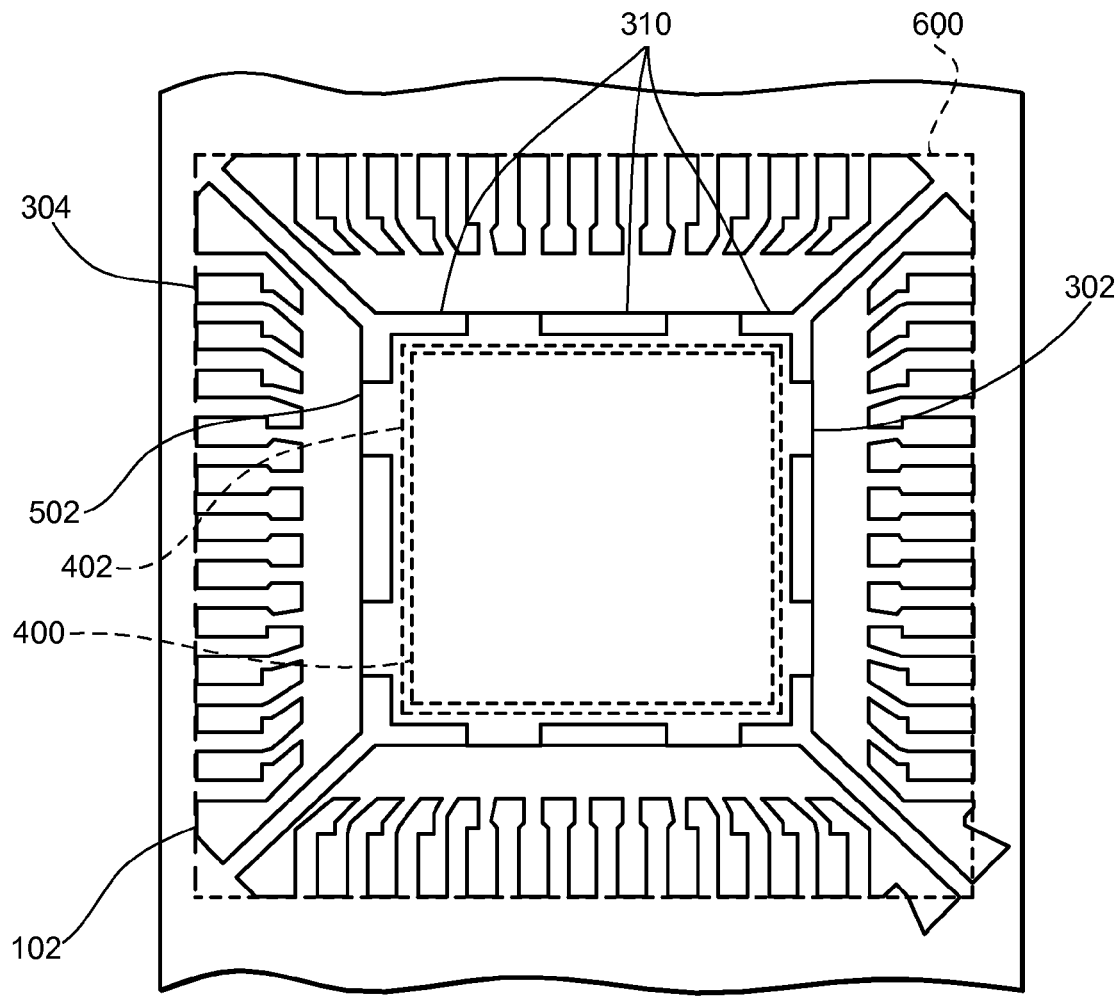
FIG. 6 is a plan view of the structure of FIG. 5 manufactured in accordance with the present invention without an encapsulant.

Referring now to FIG. 6, therein is shown a plan view of the structure of FIG. 5 without the encapsulant 502 having the number of mold dams 310 manufactured in accordance with the present invention. The leadframe 102 includes the die attach paddle 302 and the number of leads 304 surrounding the die attach paddle 302. The die attach paddle 302 has been processed to form the number of mold dams 310 around the periphery of the die attach paddle 302 and the recess in the die attach paddle 302. The bonding compound 402 shown in FIG. 5 is deposited on the die attach paddle 302. The integrated circuit 400 is positioned over the bonding compound 402 to attach the integrated circuit 400 to the die attach paddle 302. The encapsulant 502 fills the spaces between the mold dams 310 to provide the locking mechanism for locking the encapsulant 502 and the die attach paddle 302.

An edge 600 is formed during a singulation process after the semiconductor is encapsulated.

Figure 7:
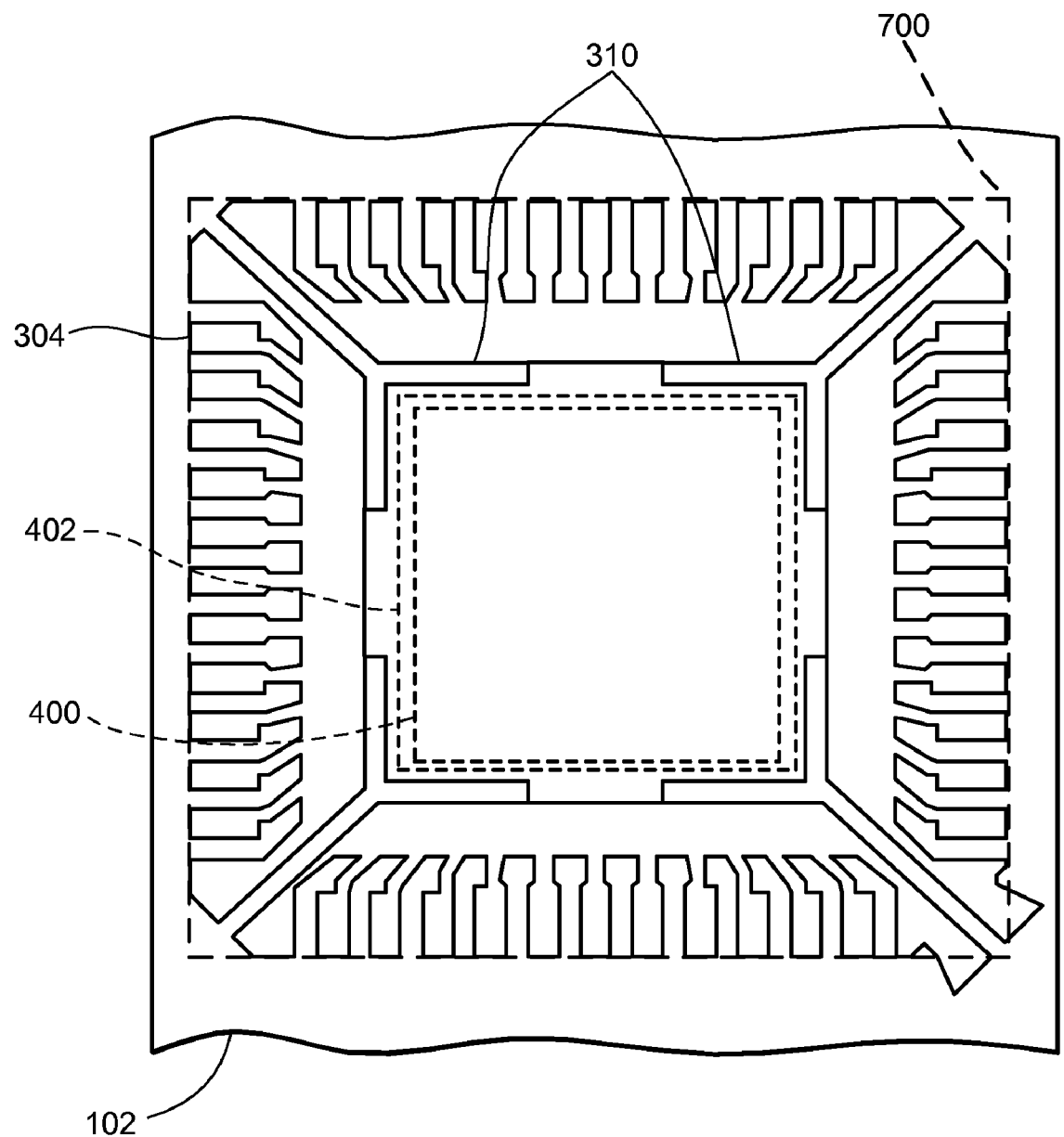
FIG. 7 is a plan view of another embodiment of a leadframe having four mold dams manufactured in accordance with the present invention.

Referring now to FIG. 7 therein is shown a plan view of another embodiment of the semiconductor 100 having four mold dams 310 manufactured in accordance with the present invention. The number of mold dams 310 is formed at each corner of the die attach paddle 302 to form four mold dams. It will be apparent to those skilled in the art that a particular semiconductor may have any number of mold dams 310 depending upon the design requirements for a particular semiconductor. The encapsulant 502 fills the spaces between the mold dams 310 to provide the locking mechanism for locking the encapsulant 502 and the die attach paddle 302.

An edge 700 is formed during a singulation process after the semiconductor is encapsulated.

Figure 8:
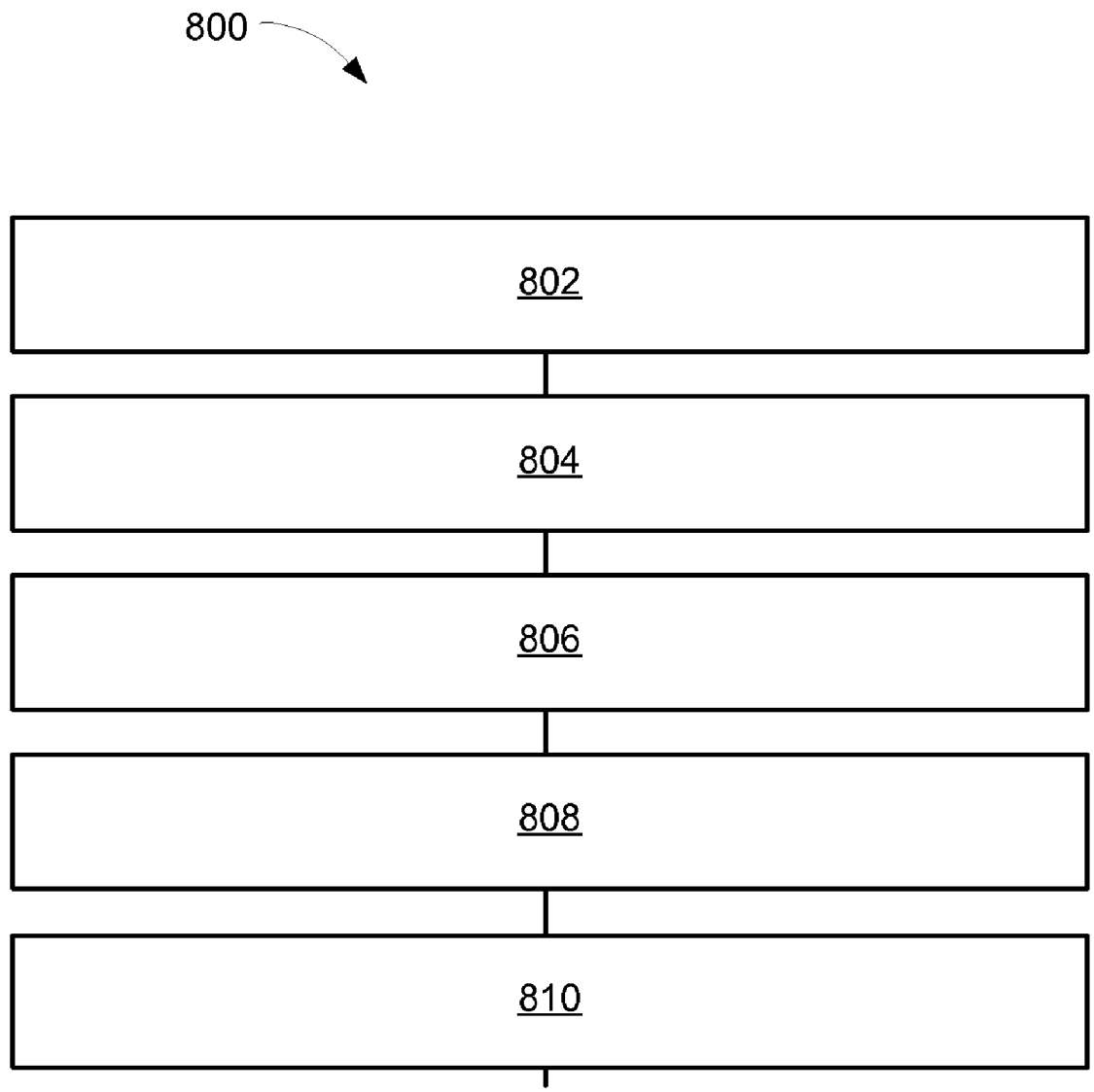
FIG. 8 is a flow chart of a method for manufacturing a leadframe in accordance with the present invention.

Referring now to FIG. 8 therein is shown a flow chart of a method 800 for manufacturing a semiconductor in accordance with the present invention. The method 800 includes providing a leadframe having a die attach paddle and a number of leads in a block 802; forming a recess in the die attach paddle to provide a number of mold dams around the periphery of the die attach paddle in a block 804; positioning an integrated circuit in the recess in a block 806; forming electrical connections between the integrated circuit and the number of leads in a block 808; and forming an encapsulant over the integrated circuit and around the number of mold dams in a block 810.

Thus, it has been discovered that the method and apparatus of the present invention furnish important and heretofore unavailable solutions, capabilities, and functional advantages for the manufacture of semiconductors. The resulting process and configurations are straightforward, economical, uncomplicated, highly versatile, and effective, use conventional technologies, and are thus readily suited for manufacturing semiconductor devices and are fully compatible with conventional manufacturing processes and technologies.

While the invention has been described in conjunction with a specific best mode, it is to be understood that many alternatives, modifications, and variations will be apparent to those skilled in the art in light of the foregoing description. Accordingly, it is intended to embrace all such alternatives, modifications, and variations that fall within the scope of the included claims. All matters set forth herein or shown in the accompanying drawings are to be interpreted in an illustrative and non-limiting sense.

The invention claimed is:

1. A method of manufacturing a semiconductor comprising:
    providing a leadframe having a die attach paddle and a number of leads;
    forming a recess in the die attach paddle to provide a number of mold dams around the periphery of the die attach paddle;
    positioning an integrated circuit in the recess;
    forming electrical connections between the integrated circuit and the number of leads; and
    forming an encapsulant over the integrated circuit and around the number of mold dams.

2. The method of manufacturing a semiconductor as claimed in claim 1 wherein forming a recess in the die attach paddle forms a recess about fifty-five percent of the way through the die attach paddle.

3. The method of manufacturing a semiconductor as claimed in claim 1 wherein providing a number of mold dams around the periphery of the die attach paddle provides the number of mold dams in a position of at least one of at the corners of the die attach paddle, intermediate the corners of the die attach paddle, and combinations thereof.

4. The method of manufacturing a semiconductor as claimed in claim 1 wherein forming an encapsulant flows the encapsulant into the spaces between the mold dams and over the integrated circuit.

5. The method of manufacturing a semiconductor as claimed in claim 1 wherein forming the encapsulant forms at least one of plastic, epoxy, ceramic, and combinations thereof.

6. A method of manufacturing a semiconductor comprising:
    providing a leadframe having a die attach paddle and a number of leads;
    etching a recess at least half way into the die attach paddle to provide a number of mold dams around the periphery of the die attach paddle;
    bonding an integrated circuit in the recess;
    wire bonding electrical connections between the integrated circuit and the number of leads; and
    forming an encapsulant over the integrated circuit and around the number of mold dams.

7. The method of manufacturing a semiconductor as claimed in claim 6 wherein forming a recess into the die attach paddle forms a recess about fifty-five percent of the way through the die attach paddle.

8. The method of manufacturing a semiconductor as claimed in claim 6 wherein providing a number of mold dams around the periphery of the die attach paddle provides the number of mold dams in a position of at least one of at the corners of the die attach paddle, intermediate the corners of the die attach paddle, and combinations thereof.

9. The method of manufacturing a semiconductor as claimed in claim 6 wherein forming an encapsulant flows the encapsulant into the spaces between the mold dams and over the integrated circuit.

10. The method of manufacturing a semiconductor as claimed in claim 6 wherein forming the encapsulant forms an encapsulant of at least one of plastic, epoxy, ceramic, and combinations thereof.

11. A semiconductor comprising:
    a leadframe having a die attach paddle and a number of leads;
    the die attach paddle having a recess to provide a number of mold dams around the periphery of the die attach paddle;
    an integrated circuit in the recess;
    electrical connections between the integrated circuit and the number of leads; and
    an encapsulant over the integrated circuit and around the number of mold dams.

12. The semiconductor as claimed in claim 11 wherein the recess in the die attach paddle is about fifty-five percent of the way through the die attach paddle.

13. The semiconductor as claimed in claim 11 wherein the number of mold dams is positioned in at least one of at the corners of the die attach paddle, intermediate the corners of the die attach paddle, and combinations thereof.

14. The semiconductor as claimed in claim 11 wherein the encapsulant substantially fills the spaces between the number of mold dams.

15. The semiconductor as claimed in claim 11 wherein the encapsulant comprises at least one of plastic, epoxy, ceramic, and combinations thereof.

16. A semiconductor comprising:
    a leadframe having a die attach paddle and a number of leads;
    the die attach paddle having a recess at least half way into the die attach paddle to provide a number of mold dams around the periphery of the die attach paddle;
    an integrated circuit in the recess;
    electrical connections between the integrated circuit and the number of leads; and
    an encapsulant over the integrated circuit and around the number of mold dams.

17. The semiconductor as claimed in claim 16 wherein the recess into the die attach paddle is about fifty-five percent of the way through the die attach paddle.

18. The semiconductor as claimed in claim 16 wherein the number of mold dams around the periphery of the die attach paddle is positioned in at least one of at the corners of the die attach paddle, intermediate the corners of the die attach paddle, and combinations thereof.

19. The semiconductor as claimed in claim 16 wherein the encapsulant substantially fills the spaces between the mold dams.

20. The semiconductor as claimed in claim 16 wherein the encapsulant comprises an encapsulant of at least one of plastic, epoxy, ceramic, and combinations thereof.

* * * * *